United States Patent
Liao et al.

(10) Patent No.: US 11,955,890 B2
(45) Date of Patent: Apr. 9, 2024

(54) SWITCHING CONVERTER CIRCUIT AND DRIVER CIRCUIT HAVING ADAPTIVE DEAD TIME THEREOF

(71) Applicant: RICHTEK TECHNOLOGY CORPORATION, Zhubei (TW)

(72) Inventors: Ting-Wei Liao, Taichung (TW); Chien-Yu Chen, Kaohsiung (TW); Kun-Huang Yu, Hsinchu (TW); Chien-Wei Chiu, Yunlin (TW); Ta-Yung Yang, Taoyuan (TW)

(73) Assignee: RICHTEK TECHNOLOGY CORPORATION, Hsinchu (TW)

( * ) Notice: Subject to any disclaimer, the term of this patent is extended or adjusted under 35 U.S.C. 154(b) by 300 days.

(21) Appl. No.: 17/567,130

(22) Filed: Jan. 2, 2022

(65) Prior Publication Data
US 2022/0239224 A1    Jul. 28, 2022

Related U.S. Application Data

(60) Provisional application No. 63/141,406, filed on Jan. 25, 2021.

(30) Foreign Application Priority Data

Jul. 26, 2021    (TW) ................................ 110127400

(51) Int. Cl.
*H02M 1/38*    (2007.01)
*H02M 1/00*    (2006.01)
(Continued)

(52) U.S. Cl.
CPC ......... *H02M 3/158* (2013.01); *H02M 1/0006* (2021.05); *H02M 1/08* (2013.01);
(Continued)

(58) Field of Classification Search
CPC ........ H02M 1/0006; H02M 1/08; H02M 1/38; H02M 3/158; H03K 2217/0063; H03K 2217/0072; H03K 17/063
See application file for complete search history.

(56) References Cited

U.S. PATENT DOCUMENTS 9,166,469 B2 * 10/2015 Familiant ................. H02M 1/38
2004/0041619 A1 * 3/2004 Nadd ...................... H02M 1/38
                                                                    327/436

(Continued)

*Primary Examiner* — Kyle J Moody
*Assistant Examiner* — Jye-June Lee
(74) *Attorney, Agent, or Firm* — Tung & Associates (57) ABSTRACT

A switching converter circuit for switching one end of an inductor therein between plural voltages according to a pulse width modulation (PWM) signal to convert an input voltage to an output voltage. The switching converter circuit has a driver circuit including a high side driver, a low side driver, a high side sensor circuit, and a low side sensor circuit. The high side sensor circuit is configured to sense a gate-source voltage of a high side metal oxide semiconductor field effect transistor (MOSFET), to generate a low side enable signal for enabling the low side driver to switch a low side MOSFET according to the PWM signal. The low side sensor circuit is configured to sense a gate-source voltage of a low side MOSFET, to generate a high side enable signal for enabling the high side driver to switch a high side MOSFET according to the PWM signal.

20 Claims, 7 Drawing Sheets

(51) Int. Cl.
H02M 1/08 (2006.01)
H02M 3/158 (2006.01)
H03K 17/06 (2006.01)

(52) U.S. Cl.
CPC ............ H02M 1/38 (2013.01); H03K 17/063 (2013.01); *H03K 2217/0063* (2013.01); *H03K 2217/0072* (2013.01)

(56) References Cited

U.S. PATENT DOCUMENTS

| | | | | |
|---|---|---|---|---|
| 2006/0164867 | A1* | 7/2006 | Dikken | H02M 1/38 363/13 |
| 2007/0085589 | A1* | 4/2007 | Yoshikawa | H02M 1/38 327/333 |
| 2008/0088283 | A1* | 4/2008 | Ruobiao | H02M 3/1588 323/285 |
| 2015/0256075 | A1* | 9/2015 | Lin | H02M 1/38 323/271 |
| 2022/0239223 | A1* | 7/2022 | Liao | H02M 1/385 |

* cited by examiner

SWITCHING CONVERTER CIRCUIT AND DRIVER CIRCUIT HAVING ADAPTIVE DEAD TIME THEREOF

CROSS REFERENCE

The present invention claims priority to U.S. 63/141,406 filed on Jan. 25, 2021, and claims priority to TW 110127400 filed on Jul. 26, 2021.

BACKGROUND OF THE INVENTION

Field of Invention

The present invention relates to a switching converter circuit, and particularly to a switching converter circuit which has adaptive dead time and can avoid short-circuit current. The present invention also relates to a driver circuit of such a switching converter circuit.

Description of Related Art

Figure 1A:
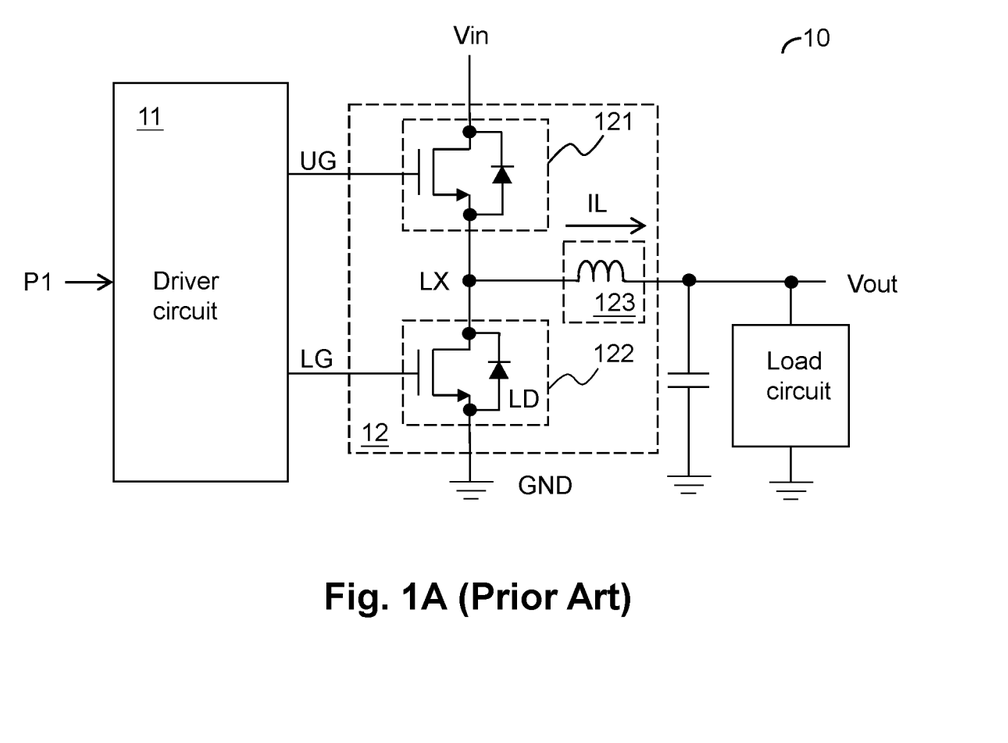
FIG. 1A illustrates a schematic diagram of a conventional switching converter circuit 10.

FIG. 1A illustrates a schematic circuit diagram of a conventional switching converter circuit 10. The switching converter circuit 10 includes a driver circuit 11 and a power stage circuit 12. As shown in FIG. 1A, the power stage circuit 12 includes a high side switch 121, a low side switch 122 and an inductor 123. The driver circuit 11 generates a high side signal UG and a low side signal LG according to a pulse width modulation (PWM) signal P1. The high side switch 121 and the low side switch 122 operate according to the high side signal UG and the low side signal LG respectively, so as to convert an input voltage Vin to an output voltage Vout and generate an inductor current IL which flows through the inductor 123 of the power stage circuit 12.

In the switching converter circuit 10 of FIG. 1A, the power stage circuit 12 is a buck power stage circuit. During normal operation, the high side switch 121 and the low side switch 122 are turned ON alternatingly to switch one terminal of the inductor 123, to which a phase node LX is electrically connected, between the input voltage Vin and a ground level GND, so as to alternatingly switch the inductor current IL between the following two current paths: one is to flow from the input voltage Vin through the high side switch 121 to the phase node LX and further through the inductor L to the output terminal; the other is to flow from the ground level GND through the low side switch 122 to the phase node LX and further through the inductor L to the output terminal. During normal operation, the high side switch 121 and the low side switch 122 must be prevented from being turned ON at the same time, so as to prevent shoot through which can cause the circuit to be damaged. Therefore, a dead time, in which both the high side switch 121 and the low side switch 122 are OFF, is needed to isolate the ON periods of the high side switch 121 and the low side switch 122.

Figure 1B:
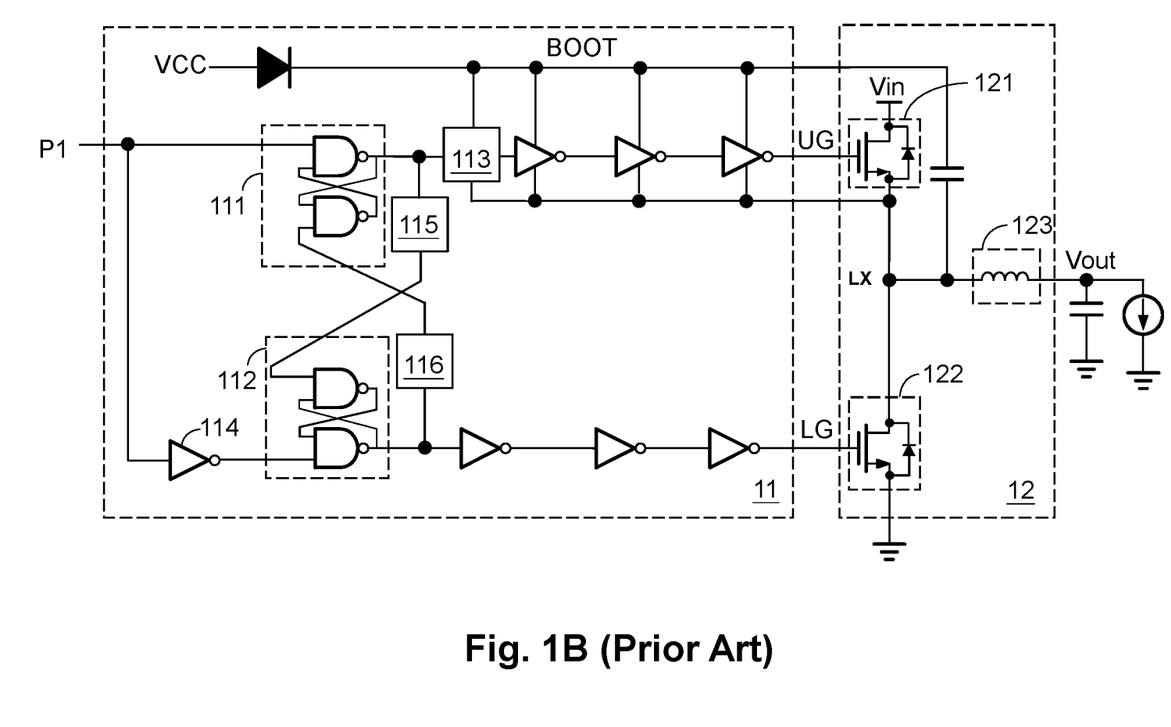
FIG. 1B illustrates a schematic circuit diagram of a conventional driver circuit 11.

FIG. 1B illustrates a schematic circuit diagram of a conventional driver circuit 11. As shown in FIG. 1B, the driver circuit 11 includes latch circuits 111 and 112, a level shift circuit 113, an inverter 114, delay circuits 115 and 116 and other plural inverters. The PWM signal P1 serves as a reset signal of the latch circuit 111. When the PWM signal P1 is at low level, the latch circuit 111 outputs a signal at high level, which passes through the level shift circuit 113 and three inverters to generate the high side signal UG at low level, so as to turn OFF the high side switch 121. When the PWM signal P1 is switched to high level, whether the high side signal UG is switched to high level to turn ON the high side switch 121 is determined according to the output signal of the delay circuit 116.

On the other hand, the PWM signal P1 passes through the inverter 114 which generates an inverted signal to serve as a reset signal of the latch circuit 112. When the PWM signal P1 is at high level, the latch circuit 112 outputs a signal at high level, which passes through three inverters to generate the low side signal LG at low level, so as to turn OFF the low side switch 122. When the PWM signal P1 is switched to low level, whether the low side signal LG is switched to high level to turn ON the high side switch 121 is determined according to the output signal of the delay circuit 115.

The output signal of the latch circuit 111 is delayed by the delay circuit 115 for a predetermined constant high side delay time, and the delayed output signal is inputted to the latch circuit 112 to serve as a set signal of the latch circuit 112, so as to enable the latch circuit 112 to generate the low side signal LG according to an inverted signal of the PWM signal P1. On the other hand, the output signal of the latch circuit 112 is delayed by the delay circuit 116 for a predetermined constant low side delay time, and the delayed output signal is inputted to the latch circuit 111 to serve as a set signal of the latch circuit 111, so as to enable the latch circuit 111 to generate the high side signal UG according to the PWM signal P1.

The high side delay time must be long enough to cover the dead time after the ON period of the high side switch 121 ends, and the low side delay time must be long enough to cover the dead time after the ON period of the low side switch 122 ends, so as to prevent the high side switch 121 and the low side switch 122 from being turned ON at the same time. The driver circuit 11 generates a bootstrap voltage BOOT according to a DC voltage VCC. After the PWM signal P1 passes through the latch circuit 111, the level shift circuit 113 shifts the level of the PWM signal P1 to a boot voltage domain.

Referring to FIGS. 1A and 1B, during normal operation of the switching converter circuit 10, there are two dead times in one switching cycle, and each dead time is a predetermined constant time period. After the ON period of the low side switch 122 ends, the high side switch 121 is turned ON after the constant dead time. After this dead time, the body diode LD in the low side switch 122 is switched from forward bias condition to reverse bias condition. During another dead time after the ON period of the high side switch 121 ends, in which the low side switch 122 is not turned ON yet, the body diode LD in the low side switch 122 is switched from reverse bias condition to forward bias condition. In this dead time, the inductor current IL only flows from the ground level GND through the body diode LD in the low side switch 122 to the phase node LX and further through the inductor L. In other words, in every switching cycle, between the switchings of the high side switch 121 and the low side switch 122, there are two dead times. During these two dead times, two bias reversals occur in the PN junction of the body diode LD in the low side switch 122, resulting losses of the electrical energy of the reverse recovery charges (Qrr) and time.

During normal operation of the conventional switching converter circuit 10, the dead time is a predetermined constant time and a designer must choose a constant time which is long enough to meet different dead time requirements caused by errors generated in manufacturing and operating the electronic devices and the circuitry in the switching converter circuit 10. In other words, the dead time must be predetermined as a number that is higher than the highest dead time requirement in all conditions, so as to prevent the high side switch 121 and the low side switch 122 from being turned ON at the same time. Thus, most switching converter circuits 10 which only need a relatively shorter dead time will suffer more losses of electrical energy of reverse recovery charges (Qrr) and time, resulting in low conversion efficiency.

In view of the drawback of the above prior art, the present invention proposes a switching converter circuit and a driver circuit thereof which operate by an adaptive dead time to avoid short-circuit current that may be generated because of turning ON the high side switch and the low side switch at the same time, and can reduce energy losses due to reverse recovery charges and forward conduction, so as to enhance the conversion efficiency.

SUMMARY OF THE INVENTION

In one aspect, the present invention provides a switching converter circuit, which is configured to operably switch a first end of an inductor between a first voltage and a second voltage according to a pulse width modulation (PWM) signal to convert an input voltage to an output voltage, the switching converter circuit including: a high side metal oxide semiconductor field effect transistor (MOSFET) coupled between the first voltage and the first end of the inductor; a low side MOSFET coupled between the second voltage and the first end of the inductor; and a driver circuit including: a high side driver configured to operably generate a high side driving signal according to the PWM signal, so as to drive the high side MOSFET; a low side driver configured to operably generate a low side driving signal according to the PWM signal, so as to drive the low side MOSFET; a high side sensor circuit configured to operably sense a gate-source voltage of the high side MOSFET and generate a low side enable signal according to the gate-source voltage of the high side MOSFET, so as to indicate an OFF state of the high side MOSFET, wherein the low side enable signal enables the low side driver to switch the low side MOSFET according to the PWM signal; and a low side sensor circuit configured to operably sense a gate-source voltage of the low side MOSFET and generate a high side enable signal according to the gate-source voltage of the low side MOSFET, so as to indicate an OFF state of the low side MOSFET, wherein the high side enable signal enables the high side driver to switch the high side MOSFET according to the PWM signal.

In another aspect, the present invention provides a driver circuit of a switching converter circuit, the driver circuit including: a high side driver configured to operably generate a high side driving signal according to a pulse width modulation (PWM) signal, so as to drive a high side metal oxide semiconductor field effect transistor (MOSFET); a low side driver configured to operably generate a low side driving signal according to the PWM signal, so as to drive a low side MOSFET; a high side sensor circuit configured to operably sense a gate-source voltage of the high side MOSFET and generate a low side enable signal according to the gate-source voltage of the high side MOSFET, so as to indicate an OFF state of the high side MOSFET, wherein the low side enable signal enables the low side driver to switch the low side MOSFET according to the PWM signal; and a low side sensor circuit configured to operably sense a gate-source voltage of the low side MOSFET and generate a high side enable signal according to the gate-source voltage of the low side MOSFET, so as to indicate an OFF state of the low side MOSFET, wherein the high side enable signal enables the high side driver to switch the high side MOSFET according to the PWM signal.

In one preferred embodiment, the low side sensor circuit includes a low side sensor MOSFET having a conductivity type which is the same as the low side MOSFET, wherein a gate of the low side sensor MOSFET is coupled with a gate of the low side MOSFET, and a source of the low side sensor MOSFET is coupled with a source of the low side MOSFET, such that the low side sensor MOSFET generates the high side enable signal at a drain of the low side sensor MOSFET according to the gate-source voltage of the low side MOSFET.

In one preferred embodiment, the low side sensor circuit further includes a current source coupled between the high side enable signal and a bootstrap voltage of the high side driver, such that a plurality of logic levels of the high side enable signal are level shifted to a boot voltage domain, wherein the high side driver includes an enable logic circuit configured to operably receive the high side enable signal, so as to enable the high side driver to switch the high side MOSFET according to the PWM signal.

In one preferred embodiment, the low side sensor circuit further includes a current source coupled between the high side enable signal and a DC voltage, wherein the DC voltage is configured to operably generate a bootstrap voltage of the high side driver, wherein the high side driver includes an enable logic circuit and a level shift circuit coupled with each other to receive the high side enable signal, so as to enable the high side driver to switch the high side MOSFET according to the PWM signal.

In one preferred embodiment, the low side sensor circuit includes a low side comparator configured to operably compare the gate-source voltage of the low side MOSFET with a low side reference voltage, so as to generate the high side enable signal, and wherein the high side driver includes an enable logic circuit and a level shift circuit coupled with each other to receive the high side enable signal, so as to enable the high side driver to switch the high side MOSFET according to the PWM signal.

In one preferred embodiment, an absolute value of a conduction threshold voltage of a high side sensor MOSFET of the high side sensor circuit is lower than or equal to an absolute value of a conduction threshold voltage of the high side MOSFET, wherein an absolute value of a conduction threshold voltage of the low side sensor MOSFET is lower than or equal to an absolute value of a conduction threshold voltage of the low side MOSFET.

In one preferred embodiment, the high side sensor circuit includes a high side sensor MOSFET having a conductivity type which is complementary to the high side MOSFET, wherein a gate of the high side sensor MOSFET is coupled with a source of the high side MOSFET, and a source of the high side sensor MOSFET is coupled with a gate of the high side MOSFET, such that the high side sensor MOSFET generates the low side enable signal at a drain of the high side sensor MOSFET according to the gate-source voltage of the high side MOSFET.

In one preferred embodiment, the high side sensor circuit includes: a high side sensor MOSFET having a conductivity type which is the same as the high side MOSFET; and a high side clamper MOSFET having a conductivity type which is complementary to the high side MOSFET, wherein the high side clamper MOSFET and the high side sensor MOSFET are coupled in series to a bootstrap voltage of the high side driver; wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

In one preferred embodiment, the high side sensor circuit includes: a high side sensor MOSFET having a conductivity type which is complementary to the high side MOSFET; and a high side clamper MOSFET having a conductivity type which is complementary to the high side MOSFET, wherein the high side clamper MOSFET and the high side sensor MOSFET are coupled in series to a bootstrap voltage of the high side driver; wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

In one preferred embodiment, the high side sensor circuit includes: a high side sensor MOSFET, wherein an absolute value of a conduction threshold voltage of the high side sensor MOSFET is lower than or equal to an absolute value of a conduction threshold voltage of the high side MOSFET, and the low side sensor circuit includes a low side sensor MOSFET, wherein an absolute value of a conduction threshold voltage of the low side sensor MOSFET is lower than or equal to an absolute value of a conduction threshold voltage of the low side MOSFET.

In one preferred embodiment, the high side MOSFET has a conductivity type which is the same as the low side MOSFET.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
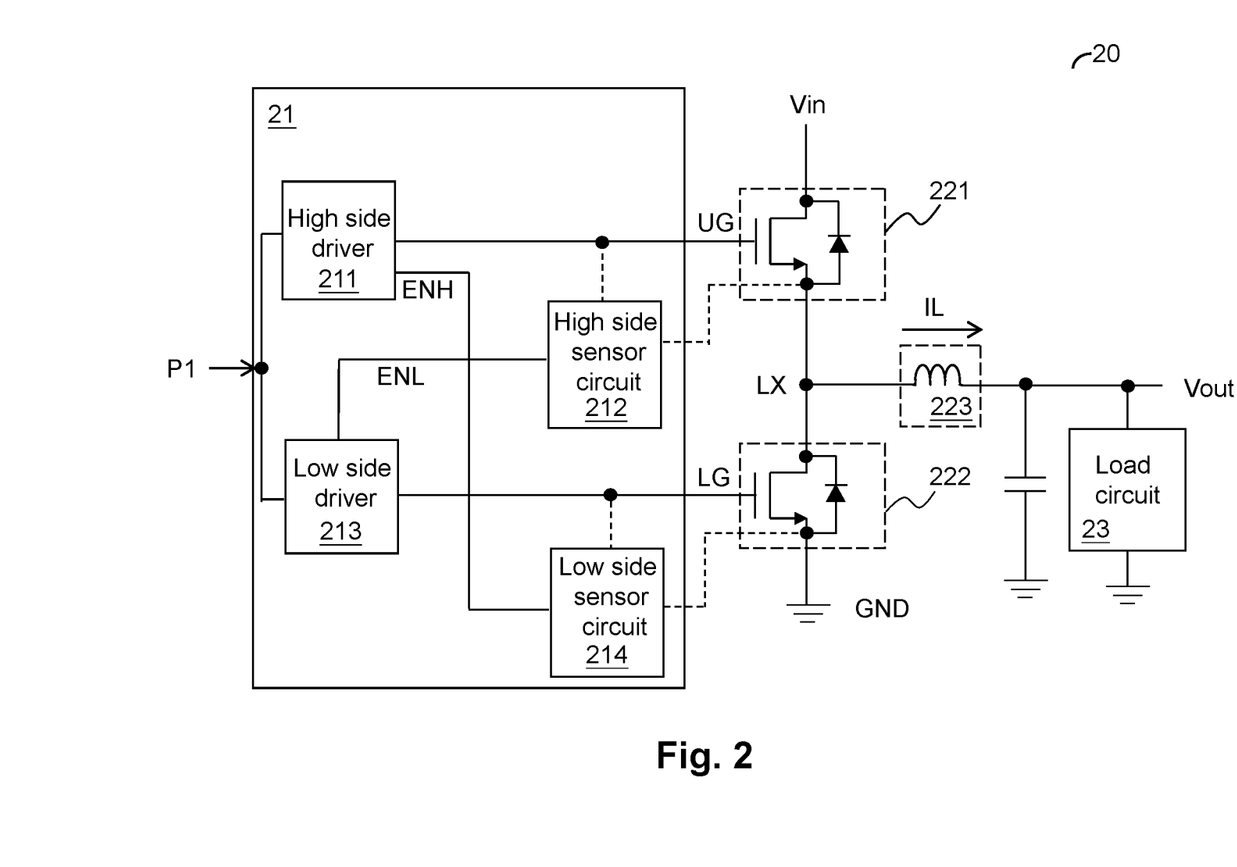
FIG. 2 illustrates a schematic diagram of a switching converter circuit 20 in accordance with the present invention.

FIG. 2 illustrates a schematic diagram of a switching converter circuit 20 in accordance with the present invention. The switching converter circuit 20 is configured to operably switch a first end (an end electrically connected to a phase node LX in this embodiment) of an inductor 223 between a first voltage (an input voltage Vin in this embodiment) and a second voltage (a ground level GND in this embodiment) according to a pulse width modulation (PWM) signal P1 to convert the input voltage Vin to an output voltage Vout, so as to provide power for a load circuit 23. The switching converter circuit 20 includes a high side metal oxide semiconductor field effect transistor (MOSFET) 221, a low side MOSFET 222 and a driver circuit 221.

In this embodiment, the high side MOSFET 221 is coupled between the input voltage Vin and the phase node LX (the first end of the inductor 223). The low side MOSFET 222 is coupled between the ground level GND and the phase node LX (the first end of the inductor 223). Note that besides the buck power stage circuit, the present invention can also be applied to a boost power stage circuit or a buck-boost power stage circuit. The present invention can be applied to all types of power stage circuits having high side MOSFET and low side MOSFET to improve the conversion efficiency and reduce the reverse recovery charge loss.

The driver circuit 21 is configured to operably generate a high side driving signal UG and a low side driving signal LG according to the PWM signal P1 which is related to a feedback signal of the output voltage Vout to operate the high side MOSFET 221 and the low side MOSFET 222 correspondingly, so as to switch the first end of the inductor 223 between the first voltage (the input voltage Vin) and the second voltage (the ground level GND). The driver circuit 21 includes a high side driver 211, a low side driver 213, a high side sensor circuit 212 and a low side sensor circuit 214.

The high side driver 211 is configured to operably generate the high side driving signal UG according to the PWM signal P1, so as to drive the high side MOSFET 221. The low side driver 213 is configured to operably generate the low side driving signal LG according to the PWM signal P1, so as to drive the low side MOSFET 222. The high side sensor circuit 212 is configured to operably sense a gate-source voltage of the high side MOSFET 221 and generate a low side enable signal ENL, so as to indicate an OFF state of the high side MOSFET 221. The low side enable signal ENL enables the low side driver 213 to switch the low side MOSFET 222 according to the PWM signal P1. The low side sensor circuit 214 is configured to operably sense a gate-source voltage of the low side MOSFET 222 and generate a high side enable signal ENH, so as to indicate an OFF state of the low side MOSFET 222. The high side enable signal ENH enables the high side driver 211 to switch the high side MOSFET 221 according to the PWM signal P1.

More specifically, taking the embodiment shown in FIG. 2 as an example, the high side MOSFET 221 is for example an N type MOSFET. The high side sensor circuit 212 senses the gate-source voltage of the high side MOSFET 221. When the absolute value of the gate-source voltage of the high side MOSFET 221 is larger than a first threshold voltage, indicating that the high side MOSFET 221 is ON or is almost turned ON, the high side sensor circuit 212 for instance changes the low side enable signal ENL to a disable level, so as to disable turning ON the low side MOSFET 222. In one preferred embodiment, the first threshold voltage is for example positive and lower than or equal to the conduction threshold voltage of the high side MOSFET 221, so as to ensure that the low side enable signal ENL is changed to the disable level when the high side MOSFET 221 is turned ON. Therefore, it can be ensured that when the high side MOSFET 221 is turned ON, the low side MOSFET 222 is sure OFF. The conduction threshold voltage of the high side MOSFET 221 is for instance a positive value.

On the other hand, when the gate-source voltage of the high side MOSFET 221 is lower than the first threshold voltage, indicating that the high side MOSFET 221 is OFF, the high side sensor circuit 212 for example changes the low side enable signal ENL to an enable level, so as to enable the low side driver 213 to switch the low side MOSFET 222 according to the PWM signal P1.

Likely, when the high side MOSFET 221 is a P type MOSFET, the high side sensor circuit 212 for instance senses the gate-source voltage of the high side MOSFET 221. When the absolute value of the gate-source voltage of the high side MOSFET 221 is larger than the first threshold voltage, indicating that the high side MOSFET 221 is ON or is almost turned ON, the high side sensor circuit 212 changes the low side enable signal ENL to a high-level disable level, so as to disable turning ON the low side MOSFET 222. Thus, it can be ensured that when the high side MOSFET 221 is turned ON, the low side MOSFET 222 is sure OFF. The high side MOSFET 221 is for instance a P type MOSFET, and the conduction threshold voltage thereof is for example a negative value. The first threshold voltage is lower than or equal to the absolute value of the conduction threshold voltage of the high side MOSFET 221.

On the other hand, when the absolute value of the gate-source voltage of the high side MOSFET 221 is smaller than the first threshold voltage, indicating that the high side MOSFET 221 is OFF, the high side sensor circuit 212 for instance changes the low side enable signal ENL to the enable level, so as to enable the low side driver 213 to switch the low side MOSFET 222 according to the PWM signal P1.

Please continue referring to FIG. 2. As shown in FIG. 2, the low side MOSFET 222 is for example an N type MOSFET. The low side sensor circuit 214 senses the gate-source voltage of the low side MOSFET 222. When the absolute value of the gate-source voltage of the low side MOSFET 222 is larger than a second threshold voltage, indicating that the low side MOSFET 222 is ON, the low side sensor circuit 214 for instance changes the high side enable signal ENH to high level. In one preferred embodiment, the second threshold voltage is for example a positive value and lower than or equal to the conduction threshold voltage of the low side MOSFET 222, so as to ensure that the high side enable signal ENH is changed to the disable level when the low side MOSFET 222 is turned ON. Therefore, it can be ensured that when the low side MOSFET 222 is turned ON, the high side MOSFET 221 is sure OFF. The conduction threshold voltage of the low side MOSFET 222 is for instance a positive value. In one preferred embodiment, the high side MOSFET 221 has a conductivity type which is the same as the low side MOSFET 222, for instance both are N type MOSFETs in FIG. 2.

On the other hand, when the gate-source voltage of the low side MOSFET 222 is lower than the second threshold voltage, i.e., the low side MOSFET 222 is turned OFF, the low side sensor circuit 214 for example changes the high side enable signal ENH to the enable level, so as to enable the high side driver 211 to switch the high side MOSFET 221 according to the PWM signal P1. Likely, when the low side MOSFET 222 is the P type MOSFET, the low side sensor circuit 214 for instance senses the gate-source voltage of the low side MOSFET 222. When the absolute value of the gate-source voltage of the low side MOSFET 222 is larger than the second threshold voltage, the low side sensor circuit 214 changes the high side enable signal ENH to the disable level. Thus, it can be ensured that when the low side MOSFET 222 is turned ON, the high side MOSFET 221 is sure OFF. The low side MOSFET 222 is for instance a P type MOSFET, and the conduction threshold voltage thereof is for example a negative value. The second threshold voltage is lower than or equal to the absolute value of the conduction threshold voltage of the low side MOSFET 222. The actual levels of the enable level and the disable level can be configured according to circuit requirements, which will be described later.

In summary, the high side sensor circuit 212 and the low side sensor circuit 214 sense the gate-source voltage of the high side MOSFET 221 and the gate-source voltage of the low side MOSFET 222 respectively, so as to timely enable the low side driver 213 to switch the low side MOSFET 222 according to the PWM signal P1 and enable the high side driver 211 to switch the high side MOSFET 221 according to the PWM signal P1 respectively when it is determined that the high side MOSFET 221 and the low side MOSFET 222 are OFF. Thus, the problem of overlong constant dead time to isolate the ON periods of the high side switch 121 and the low side switch 122 in the conventional switching converter circuit 10 is solved. In comparison with the prior art, the present invention can reduce losses of the electrical energy of the reverse recovery charges and time, to enhance the conversion efficiency.

Figure 3:
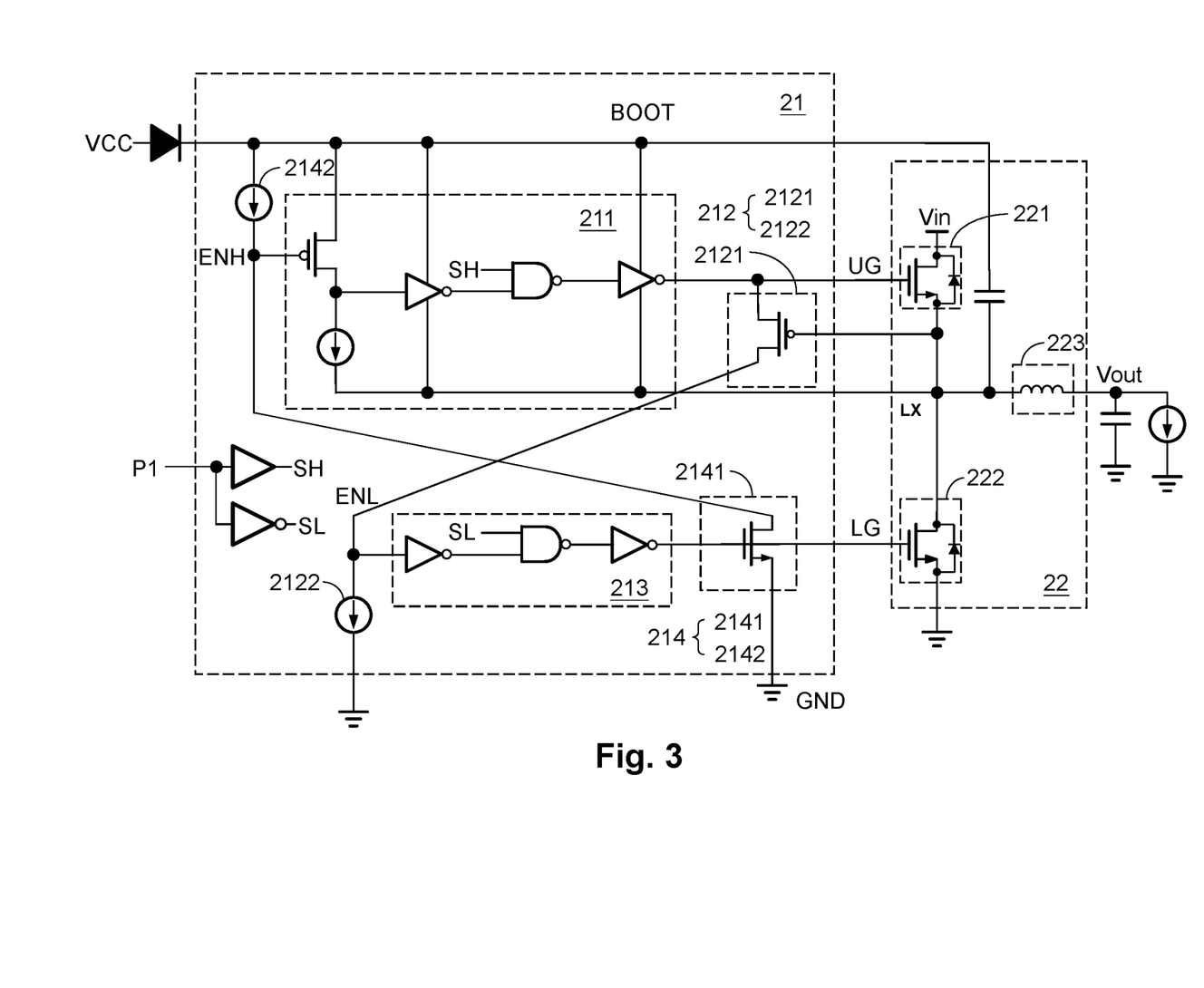
FIG. 3 illustrates one embodiment of the driver circuit 21 in accordance with the present invention.

FIG. 3 illustrates one embodiment of the driver circuit 21 in accordance with the present invention. As shown in FIG. 3, the driver circuit 21 includes a high side driver 211, a high side sensor circuit 212, a low side driver 213 and a low side sensor circuit 214. The high side sensor circuit 212 for example includes a high side sensor MOSFET 2121 and a current source 2122; the low side sensor circuit 214 for example includes a low side sensor MOSFET 2141 and a current source 2142. The PWM signal P1 generates a high side PWM signal SH via a buffer, wherein the PWM signal P1 is in-phase with the high side PWM signal SH; the PWM signal P1 generates a low side PWM signal SL via an inverter, wherein the PWM signal P1 is in opposite phase with the low side PWM signal SL.

As shown in FIG. 3, the low side sensor MOSFET 2141 has a conductivity type which is the same as the low side MOSFET 222; both the low side sensor MOSFET 2141 and the low side MOSFET 222 are for instance N type MOSFET. A gate of the low side sensor MOSFET 2141 is coupled with a gate of the low side MOSFET 222 while a source of the low side sensor MOSFET 2141 is coupled with a source of the low side MOSFET 222 as shown in FIG. 3. The source of the low side sensor MOSFET 2141 and the source of the low side MOSFET 222 are both electrically connected to a ground level GND. Thus, the low side sensor MOSFET 2141 is able to generate a high side enable signal ENH at a drain of the low side sensor MOSFET 2141 according to the gate-source voltage of the low side MOSFET 222.

Please continue referring to FIG. 3. The low side sensor circuit 214 further includes a current source 2142 coupled between the high side enable signal ENH and a bootstrap voltage BOOT of the high side driver 21, such that a plurality of logic levels of the high side enable signal ENH are level shifted to a boot voltage domain, so that the high side driver 211 is able to determine whether the low side MOSFET 222 is OFF or not according to the high side enable signal ENH. The high side driver 211 includes a level shift circuit formed by a P type MOSFET and a current source and an enable logic circuit (an inverter, a NAND gate and another inverter coupled with the NAND gate), as shown in FIG. 3. The high side driver 211 is enabled by the high side enable signal ENH to switch the high side MOSFET 221 according to the PWM signal P1.

As shown in FIG. 3, the high side driver 211 for instance includes a P type MOSFET, a current source and an NAND gate and two inverters which serve as the enable logic circuit. The low side driver 213 for example includes a NAND gate and two inverters which serve as the enable logic circuit.

In the embodiment of FIG. 3, the conduction threshold voltage of the low side sensor MOSFET 2141 is for example equal to the second threshold voltage and is lower than or equal to the conduction threshold voltage of the low side MOSFET 222. When the low side sensor MOSFET 2141 is ON, it indicates that the low side MOSFET 222 is ON or is almost turned ON and it indicates that the high side MOSFET 221 should not be turned ON. Under this situation, the low side sensor circuit 214 changes the high side enable signal ENH to the disable level (low level in this embodiment) to disable the high side PWM signal SH, so as to ensure that the high side MOSFET 221 is sure OFF. Specifically, the high side enable signal ENH is level shifted and inputted to the gate of the P type MOSFET in the high side driver 211, such that the P type MOSFET is turned ON and outputs a high-level signal to an inverter. Thus, an input end of the NAND gate in the high side driver 211 receives a low-level signal which represents digital zero, whereby, regardless what logic level the high side PWM signal SH is at, the output end of the NAND gate outputs a high-level signal which represents digital one. This high-level signal passes through an inverter to output a low-level signal, that is, the high side driving signal UG is at low level, and the high side MOSFET 221 is OFF.

When the low side sensor MOSFET 2141 is OFF, it indicates that the low side MOSFET 222 is OFF and indicates that the high side MOSFET 221 can operate according to the high side PWM signal SH at this time. Under this situation, the low side sensor circuit 214 changes the high side enable signal ENH to the enable level (high level in this embodiment), so as to enable the high side PWM signal SH. Specifically, the high side enable signal ENH is level shifted and is inputted to the gate of the P type MOSFET in the high side driver 211, such that the P type MOSFET is turned OFF and outputs a low-level signal to an inverter. Thus, an input end of the NAND gate in the high side driver 211 receives a high-level signal which represents digital one. When the high side PWM signal SH is at high level which represents digital one, the output end of the NAND gate outputs a low-level signal which represents digital zero. This low-level signal passes through an inverter to output a high-level signal, that is, the high side driving signal UG is at high level and the high side MOSFET 221 is turned ON; for the same reason, when the high side PWM signal SH is at low level which represents digital zero, the high side driving signal UG is at low level and the high side MOSFET 221 is turned OFF. In summary, when the low side sensor MOSFET 2141 is OFF, the high side enable signal ENH is at high level (enable) and the high side driver 211 switches the high side MOSFET 221 according to the PWM signal P1.

Please continue referring to FIG. 3. The high side sensor MOSFET 2121 has a conductivity type which is complementary to the high side MOSFET 221; the high sensor MOSFET 2121 is for instance P type MOSFET while the high side MOSFET 221 is for example N type MOSFET. The gate of the high side sensor MOSFET 2121 is coupled with the source of the high side MOSFET 221, and the source of the high side sensor MOSFET 2121 is coupled with the gate of the high side MOSFET 221, such that the high side sensor MOSFET 2121 generates the low side enable signal ENL at the drain of the high side sensor MOSFET 2121 according to the gate-source voltage of the high side MOSFET 221.

Please continue referring to FIG. 3. The high side sensor circuit 212 further includes a current source 2122 coupled between the low side enable signal ENL and the ground level GND, such that the low side driver 213 determines whether the high side MOSFET 221 is OFF or not according to the low side enable signal ENL. The low side driver 213 includes an enable logic circuit (a NAND gate as shown in FIG. 3) configured to operably enable the low side driver 213 according to the low side enable signal ENL, so as to switch the low side MOSFET 222 according to the PWM signal P1.

On the other hand, in one embodiment of FIG. 3, the conduction threshold voltage of the high side sensor MOSFET 2121 is equal to the first threshold voltage, and the absolute value thereof is lower than or equal to the conduction threshold voltage of the high side MOSFET 221. When the high side sensor MOSFET 2121 is ON, it indicates that the high side MOSFET 221 is ON or is almost turned ON and it indicates that the low side MOSFET 222 should not be turned ON. Under this situation, the high side sensor circuit 212 changes the low side enable signal ENL to the disable level (high level in this embodiment) to disable the low side PWM signal SL, so as to ensure that the low side MOSFET 222 is sure OFF. Specifically, the high-level low side enable signal ENL is inputted to an inverter in the low side driver 213. Thus, an input end of the NAND gate in the low side driver 213 receives a low-level signal which represents digital zero, whereby, regardless what logic level the low side PWM signal SL is at, the output end of the NAND gate outputs a high-level signal which represents digital one. This high-level signal passes through an inverter to output a low-level signal, that is, the low side driving signal LG is at low level, and the low side MOSFET 222 is OFF.

When the high side sensor MOSFET 2121 is OFF, it indicates that the high side MOSFET 221 is OFF and it indicates that the low side MOSFET 222 can operate according to the low side PWM signal SL at this time. Under this situation, the high side sensor circuit 212 changes the low side enable signal ENL to the enable level (low level in this embodiment), so as to enable the low side PWM signal SL. Specifically, the low-level low side enable signal ENL is inputted to an inverter in the low side driver 213. Thus, an input end of the NAND gate in the low side driver 213 receives a high-level signal which represents digital one. When the low side PWM signal SL is at high level which represents digital one, the output end of the NAND gate outputs a low-level signal which represents digital zero. This low-level signal passes through the inverter to output a high-level signal, that is, the low side driving signal LG is at high level and the low side MOSFET 222 is turned ON; for the same reason, when the low side PWM signal SL is at low level which represents digital zero, the low side driving signal LG is at low level and the low side MOSFET 222 is turned OFF. In summary, when the high side sensor MOSFET 2121 is OFF, the low side enable signal ENL is at low level (enable) and the low side driver 213 switches the low side MOSFET 222 according to the low side PWM signal SL, wherein the low side PWM signal SL is in opposite phase with the PWM signal P1.

Figure 4:
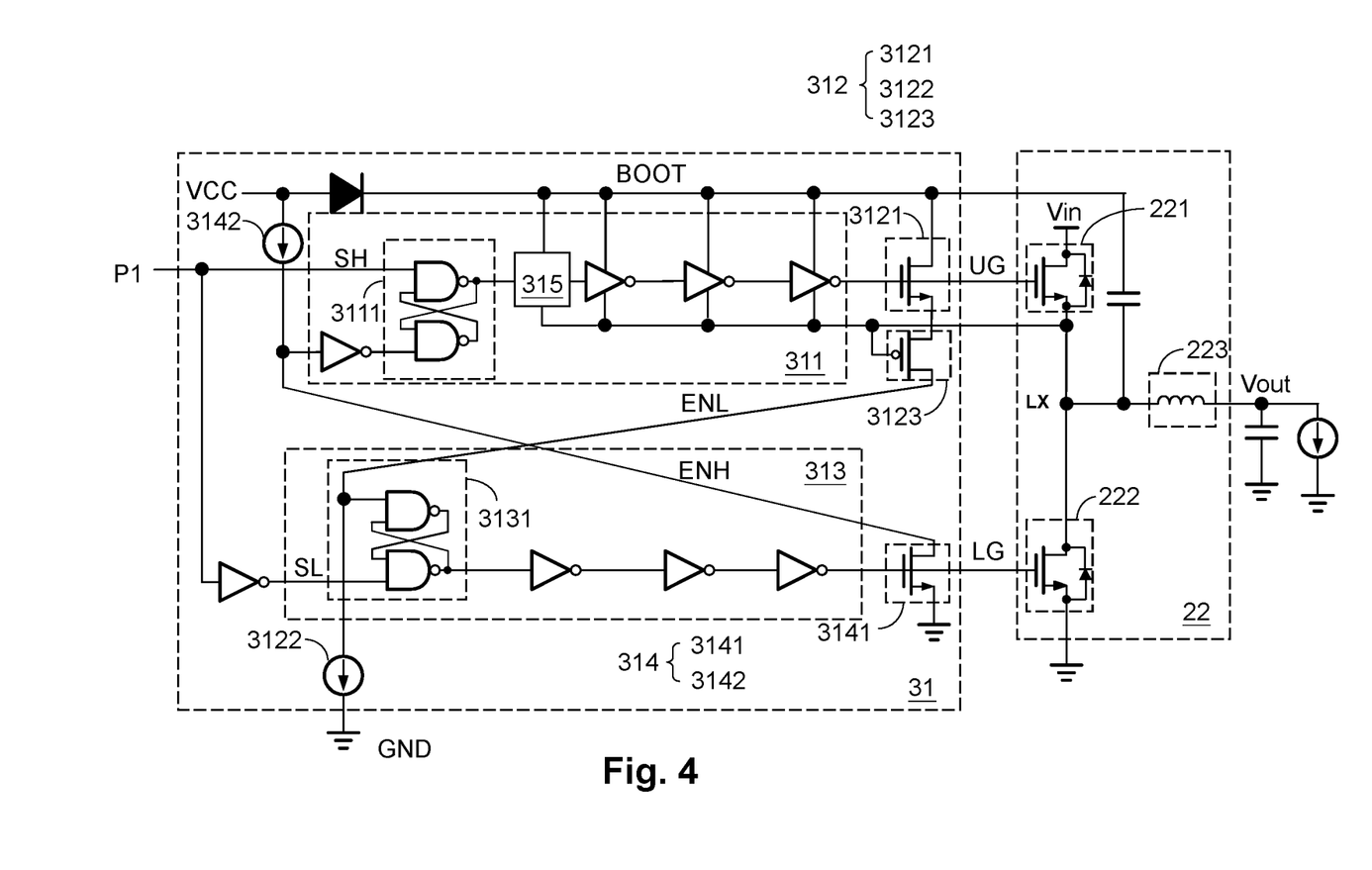
FIG. 4 illustrates one embodiment of the driver circuit 31 in accordance with the present invention.

FIG. 4 illustrates one embodiment of the driver circuit 31 in accordance with the present invention. As shown in FIG.

4, the driver circuit 31 includes a high side driver 311, a high side sensor circuit 312, a low side driver 313 and a low side sensor circuit 314. The high side sensor circuit 312 for instance includes a high side sensor MOSFET 3121, a current source 3122 and a high side clamper MOSFET 3123; the low side sensor circuit 314 for example includes a low side sensor MOSFET 3141 and a current source 3142. In this embodiment, the PWM signal P1 is shown to be the high side PWM signal SH, which indicates that the PWM signal P1 is in-phase with the high side PWM signal SH (that is, the high side PWM signal SH is not necessarily the PWM signal P1 and can be an in-phase signal of the PWM signal P1); the low side PWM signal SL is generated after the PWM signal P1 passes through an inverter, whereby the PWM signal P1 is in opposite phase with the low side PWM signal SL.

As shown in FIG. 4, the low side sensor MOSFET 3141 has a conductivity type which is the same as the low side MOSFET 222; the low side sensor MOSFET 3141 and the low side MOSFET 222 are for instance both N type MOSFET. The gate of the low side sensor MOSFET 3141 is coupled with the gate of the low side MOSFET 222, and the source of the low side sensor MOSFET 3141 is coupled with the source of the low side MOSFET 222. As shown in FIG. 4, the source of the low side sensor MOSFET 3141 and the source of the low side MOSFET 222 are both electrically connected to the ground level GND, such that the low side sensor MOSFET 3141 generates the high side enable signal ENH at the drain of the low side sensor MOSFET 3141 according to the gate-source voltage of the low side MOSFET 222.

Please continue referring to FIG. 4. The low side sensor circuit 314 further includes a current source 3142 coupled between the high side enable signal ENH and a DC voltage VCC, wherein the DC voltage VCC is configured to operably generate a bootstrap voltage BOOT of the high side driver 311. The high side driver 311 includes an enable logic circuit 3111 and a level shift circuit 315 coupled with each other. The level shift circuit 315 is configured to operably shift a level of the output signal of the enable logic circuit 3111 upward to a boot voltage domain, such that the high side driver 311 can determine whether the low side MOSFET 222 is turned OFF or not according to the high side enable signal ENH. The enable logic circuit 3111 is configured to operably receive the high side enable signal ENH, so as to enable the high side driver 311 to switch the high side MOSFET 221 according to the PWM signal P1.

In one embodiment of FIG. 4, the conduction threshold voltage of the low side sensor MOSFET 3141 is lower than or equal to the conduction threshold voltage of the low side MOSFET 222. When the low side sensor MOSFET 3141 is ON, it indicates that the low side MOSFET 222 is ON or is almost turned ON and it indicates that the high side MOSFET 221 should not be turned ON. Under this situation, the low side sensor circuit 314 changes the high side enable signal ENH to the disable level (low level in this embodiment) to disable the high side PWM signal SH, so as to ensure that the high side MOSFET 221 is sure OFF.

Specifically, the low-level high side enable signal ENH is inputted to an inverter in the high side driver 311, which outputs a high-level signal to the enable logic circuit 3111. The enable logic circuit 3111 is for instance a NAND gate latch circuit as shown in FIG. 4. Thus, an input end of the enable logic circuit 3111, for instance a reset pin of the NAND gate latch circuit, receives a high side PWM signal SH; another end of the enable logic circuit 3111, for example a set pin of the NAND gate latch circuit, receives an inverted high side enable signal which is in opposite phase with the high side enable signal ENH.

When the high side PWM signal SH is at low level which represents digital zero, the enable logic circuit 3111 outputs a high-level signal which represents digital one. After this high-level signal passes through the level shift circuit 315 and further through three inverters, a high side driving signal UG is generated at low level, whereby the high side MOSFET 221 is OFF.

When the high side PWM signal SH is changed from low level which represents digital zero to high level which represents digital one, the logic level of the high side enable signal ENH is low level which represents digital zero and the inverted high side enable signal is at high level which represents digital one. The enable logic circuit 3111 outputs a high-level signal which represents digital one. The high side driving signal UG is at low level, such that the high side MOSFET 221 is correspondingly OFF. In other words, when the high side enable signal ENH is at low level (the disable level in this embodiment), regardless what logic level the high side PWM signal SH is at, the high side driving signal UG is at low level, such that the high side MOSFET 221 is OFF.

On the other hand, when the low side sensor MOSFET 3141 is OFF, it indicates that the low side MOSFET 222 is OFF and indicates that the high side MOSFET 221 can operate according to the high side PWM signal SH at this time. Under this situation, the low side sensor circuit 314 changes the high side enable signal ENH to the enable level (the high level in this embodiment), so as to enable the high side PWM signal SH. Specifically, the inverted high side enable signal of the high side enable signal ENH is a low-level signal which represents digital zero, which is inputted to the set pin of the NAND gate latch circuit. The output signal of the NAND gate latch circuit is in opposite phase with the high side PWM signal SH. After the output signal of the NAND gate latch circuit passes through the level shift circuit 315 and further through three inverters (which form tapered buffer circuit), the high side driving signal UG becomes in-phase with the high side PWM signal SH. In other words, when the low side sensor MOSFET 3141 is OFF, it indicates that the low side MOSFET 222 is confirmed to be OFF and the high side enable signal ENH is at the high level (enable), whereby the high side driver 311 can switch the high side MOSFET 221 according to the high side PWM signal SH which is in the same phase as the PWM signal P1.

Please continue referring to FIG. 4. The high side sensor circuit 312 includes a high side sensor MOSFET 3121, a current source 3122 and a high side clamper MOSFET 3123. The high side sensor MOSFET 3121 has a conductivity type which is the same as the high side MOSFET 221; the high side clamper MOSFET 3123 has a conductivity type which is complementary to the high side MOSFET 221, wherein the high side clamper MOSFET 3123 and the high side sensor MOSFET 3121 are coupled in series to a bootstrap voltage BOOT of the high side driver 311. The high side sensor MOSFET 3121 and the high side MOSFET 221 are for instance N type MOSFET. The high side clamper MOSFET 3123 is for example P type MOSFET. The gate and the source of the high side MOSFET 221 are correspondingly coupled to the gate of the high side sensor MOSFET 3121 and the gate of the high side clamper MOSFET 3123 respectively, such that the high side sensor MOSFET 3121 and the high side clamper MOSFET 3123 generate the low side enable signal ENL at the drain of the high side clamper MOSFET 3123 according to the gate-source voltage of the high side MOSFET 221.

Please continue referring to FIG. 4. The current source 3122 of the high side sensor circuit 312 is coupled between the low side enable signal ENL and the ground level GND, such that the low side driver 313 can determine whether the high side MOSFET 221 is OFF or not according to the low side enable signal ENL. The low side driver 313 includes an enable logic circuit 3131 configured to operably receive the low side enable signal ENL, so as to enable the low side driver 313 to switch the low side MOSFET 222 according to the low side PWM signal SL which is in opposite phase with the PWM signal P1.

For instance, as shown in FIG. 4, when the high side sensor MOSFET 3121 is ON, it indicates that the high side MOSFET 221 is ON or is almost turned ON and it indicates that the low side MOSFET 222 should not be turned ON. Under this situation, the high side sensor circuit 312 changes the low side enable signal ENL to the disable level (the high level in this embodiment) to disable the low side PWM signal SL, so as to ensure that the low side MOSFET 222 is OFF.

Specifically, the high-level low side enable signal ENL is inputted to the enable logic circuit 3131. The enable logic circuit 3131 is for example the NAND gate latch circuit as shown in FIG. 4. Thus, an input end of the enable logic circuit 3131, for instance the reset pin of the NAND gate latch circuit, receives the low side PWM signal SL; another end of the enable logic circuit 3131, for example the set pin of the NAND gate latch circuit, receives the low side enable signal ENL.

When the low side PWM signal SL is at low level which represents digital zero, the enable logic circuit 3131 outputs a high-level signal which represents digital one, which passes through three inverters to generate the low side driving signal LG at low level, such that the low side MOSFET 222 is OFF.

When the low side PWM signal SL is changed from low level which represents digital zero to high level which represents digital one, the logic level of the low side enable signal ENL is high level which represents digital one. The enable logic circuit 3131 outputs a high-level signal which represents digital one. The low side driving signal LG is at low level, such that the low side MOSFET 222 is correspondingly OFF. In summary, when the low side enable signal ENL is at the high level (disable), regardless what logic level the low side PWM signal SL is at, the low side driving signal LG is at low level, such that the low side MOSFET 222 is OFF.

On the other hand, when the high side sensor MOSFET 3121 is OFF, it indicates that the high side MOSFET 221 is OFF and it indicates that the low side MOSFET 222 can operate according to the low side PWM signal SL at this time. Under this situation, the high side sensor circuit 312 changes the low side enable signal ENL to the enable level (low level in this embodiment), so as to enable the low side PWM signal SL. Specifically, the low-level low side enable signal ENL is inputted to the set pin of the NAND gate latch circuit. The output signal of the NAND gate latch circuit is in opposite phase with the low side PWM signal SL. After the output signal of the NAND gate latch circuit passes through three inverters, the low side driving signal LG becomes in-phase with the low side PWM signal SL. In other words, when the high side sensor MOSFET 3121 is OFF, it indicates that the high side MOSFET 221 is OFF and the low side enable signal ENL is at the low level (enable), whereby the low side driver 313 can switch the low side MOSFET 222 according to the low side PWM signal SL which is in opposite phase with the PWM signal P1.

Figure 5:
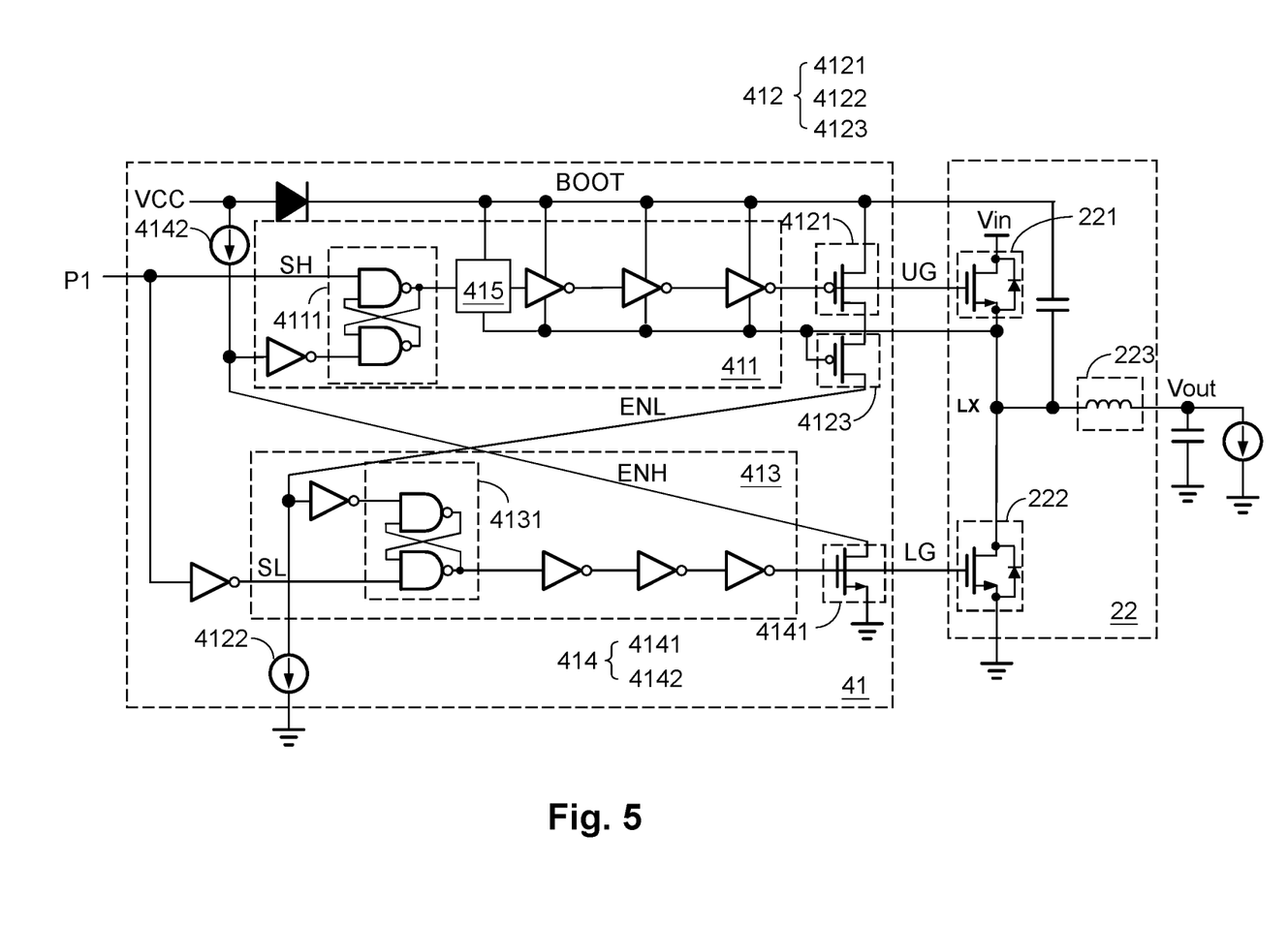
FIG. 5 illustrates one embodiment of the driver circuit 41 in accordance with the present invention.

FIG. 5 illustrates one embodiment of the driver circuit 41 in accordance with the present invention. As shown in FIG. 5, the driver circuit 41 includes a high side driver 411, a high side sensor circuit 412, a low side driver 413 and a low side sensor circuit 414. The high side sensor circuit 412 for instance includes a high side sensor MOSFET 4121, a current source 4122 and a high side clamper MOSFET 4123; the low side sensor circuit 414 for example includes a low side sensor MOSFET 4141 and a current source 4142. The high side driver 411 for instance includes an enable logic circuit 4111, a level shift circuit 415 and four inverters coupled with one another. The low side driver 413 for example includes an enable logic circuit 4131 and four inverters. In this embodiment, the PWM signal P1 is shown to be the high side PWM signal SH, which indicates that the PWM signal P1 is in-phase with the high side PWM signal SH (that is, the high side PWM signal SH is not necessarily the PWM signal P1 and can be an in-phase signal of the PWM signal P1); the low side PWM signal SL is generated after the PWM signal P1 passes through an inverter, which indicates that the PWM signal P1 is in opposite phase with the low side PWM signal SL.

The difference between this embodiment and the embodiment shown in FIG. 4 is that in this embodiment, the high side sensor MOSFET 4121 has a conductivity type which is complementary to the high side MOSFET 221. The high side sensor MOSFET 4121 is for instance P type MOSFET. The high side MOSFET 221 is for example N type MOSFET. Thus, the low side enable signal ENL of this embodiment is in opposite phase with the low side enable signal ENL in the embodiment shown in FIG. 4. In this embodiment, a signal which is the same as the low side enable signal ENL in the embodiment shown in FIG. 4 is generated after the low side enable signal ENL passes through an inverter. The other portion of this embodiment is the same as the embodiment shown in FIG. 4, and please refer to the descriptions in regard to FIG. 4.

Figure 6:
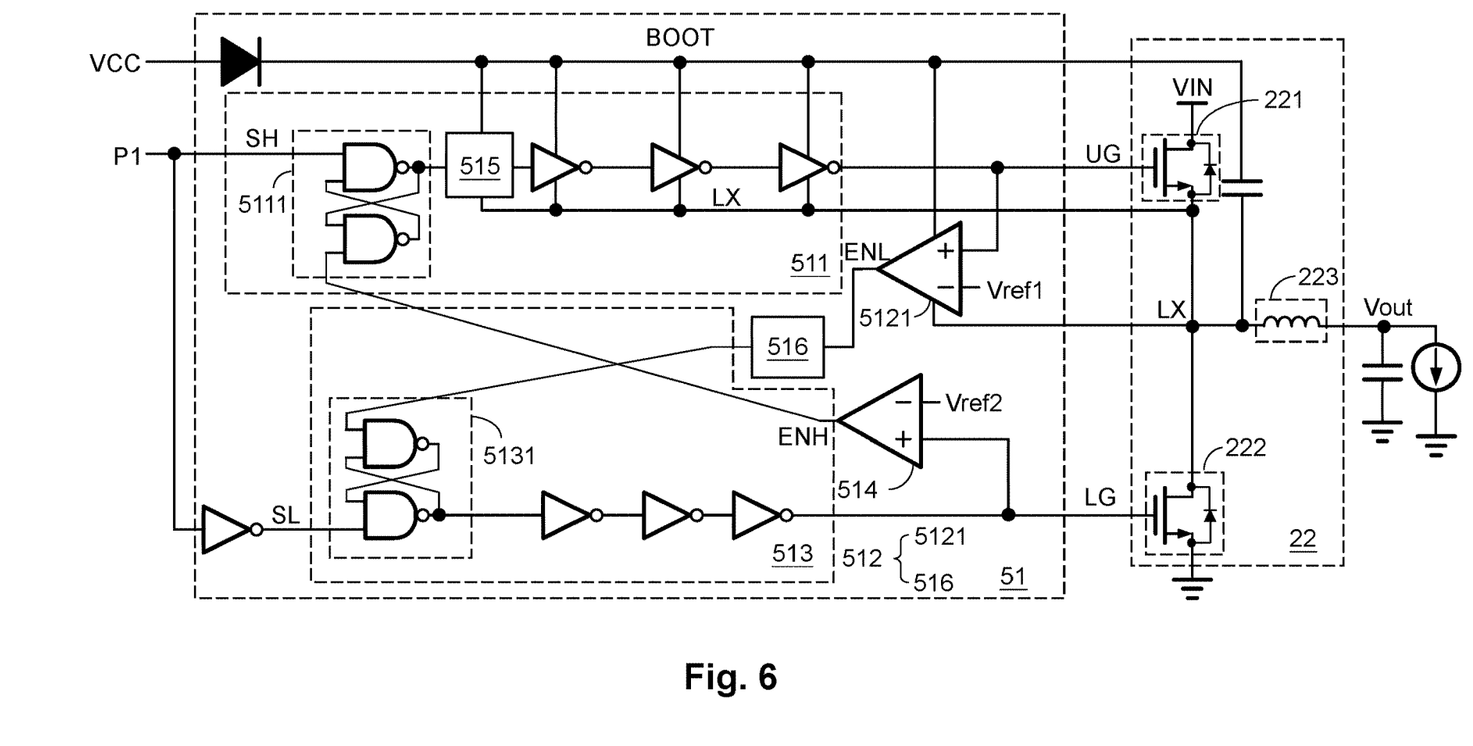
FIG. 6 illustrates one embodiment of the driver circuit 51 in accordance with the present invention.

FIG. 6 illustrates one embodiment of the driver circuit 51 in accordance with the present invention. As shown in FIG. 6, the driver circuit 51 includes a high side driver 511, a high side sensor circuit 512, a low side driver 513 and a low side sensor circuit 514. The high side sensor circuit 512 for instance includes a high side comparator 5121 and a level shift circuit 516; the low side sensor circuit for example includes a low side comparator 514. The high side driver 511 for instance includes an enable logic circuit 5111, a level shift circuit 515 and three inverters coupled with one another. The low side driver 513 for example includes an enable logic circuit 5131 and three inverters. In this embodiment, the PWM signal P1 is shown to be the high side PWM signal SH, which indicates that the PWM signal P1 is in-phase with the high side PWM signal SH (that is, the high side PWM signal SH is not necessarily the PWM signal P1 and can be an in-phase signal of the PWM signal P1); a low side PWM signal SL is generated after the PWM signal P1 passes through an inverter, wherein the PWM signal P1 is in opposite phase with the low side PWM signal SL.

As shown in FIG. 6, the low side comparator 514 is configured to operably compare the gate-source voltage of the low side MOSFET 222 with a low side reference voltage Vref2, so as to generate the high side enable signal ENH. In one preferred embodiment, the low side reference voltage Vref2 is lower than or equal to the conduction threshold voltage of the low side MOSFET 222, such that the low side comparator 514 generates the high side enable signal ENH at the output end of the low side comparator 514 according to the gate-source voltage of the low side MOSFET 222.

Please continue referring to FIG. 6. The enable logic circuit 5111 of the high side driver 511 is configured to operably receive the high side enable signal ENH, so as to enable the high side driver 511 to switch the high side MOSFET 221 according to the PWM signal P1.

For instance, as shown in FIG. 6, when the low side MOSFET 222 is ON or is almost turned ON, it indicates that the high side MOSFET 221 should not be turned ON. Under this situation, the low side comparator 514 changes the high side enable signal ENH to the disable level (the high level in this embodiment) according to that the low side driving signal LG is higher than the low side reference voltage Vref2 to disable the high side PWM signal SH, so as to ensure that the high side MOSFET 221 is sure OFF.

Specifically, the high-level high side enable signal ENH is inputted to the enable logic circuit 5111. The enable logic circuit 5111 is for example a NAND gate latch circuit as shown in FIG. 6. An input end of the enable logic circuit 5111, for instance the reset pin of the NAND gate latch circuit, receives the high side PWM signal SH; another end of the enable logic circuit 5111, for example the set pin of the NAND gate latch circuit, receives the high side enable signal ENH.

When the high side PWM signal SH is at low level which represents digital zero, the enable logic circuit 5111 outputs a high-level signal which represents digital one. After this high-level signal passes through the level shift circuit 515 and further through three inverters, a high side driving signal UG is generated at low level, such that the high side MOSFET 221 is OFF.

When the high side PWM signal SH is changed from low level which represents digital zero to high level which represents digital one, the logic level of the high side enable signal ENH is high level which represents digital one. The enable logic circuit 5111 outputs a high-level signal which represents digital one. The high side driving signal UG is at low level, such that the high side MOSFET 221 is correspondingly OFF. In summary, when the high side enable signal ENH is at the high level (disable), regardless what logic level the high side PWM signal SH is at, the high side driving signal UG is at low level, such that the high side MOSFET 221 is sure OFF.

On the other hand, when the low side MOSFET 222 is OFF and the gate-source voltage of the low side MOSFET 222 is lower than the low side reference voltage Vref2, it indicates that the high side MOSFET 221 can operate according to the high side PWM signal SH at this time. Under this situation, the low side comparator 514 changes the high side enable signal ENH to the enable level (low level in this embodiment), so as to enable the high side PWM signal SH. Specifically, the low-level high side enable signal ENH is inputted to the set pin of the NAND gate latch circuit in the enable logic circuit 5111. The output signal of the NAND gate latch circuit is in opposite phase with the high side PWM signal SH. After the output signal of the NAND gate latch circuit passes through the level shift circuit 515 and further through three inverters, the high side driving signal UG becomes in-phase with the high side PWM signal SH. In other words, when the low side comparator 514 changes the high side enable signal ENH to a low-level signal which represents digital zero, it indicates that the low side MOSFET 222 is confirmed to be OFF. The high side enable signal ENH is at the low level (enable). The high side driver 511 switches the high side MOSFET 221 according to the high side PWM signal SH which is in the same phase as the PWM signal P1.

Please continue referring to FIG. 6. Based on the gate-source voltage of the high side MOSFET 221 and the high side reference voltage Vref1, the high side comparator 5121 and the level shift circuit 516 of the high side sensor circuit 512 provides information for the low side driver 513 to determine whether the high side MOSFET 221 is OFF or not according to the low side enable signal ENL. In one preferred embodiment, the high side reference voltage Vref1 is lower than or equal to the conduction threshold voltage of the high side MOSFET 221. The low side driver 513 includes an enable logic circuit 5131 configured to operably enable the low side driver 513 according to the low side enable signal ENL, so as to switch the low side MOSFET 222 according to the low side PWM signal SL which is in opposite phase with the PWM signal P1.

For instance, as shown in FIG. 6, when the high side MOSFET 221 is ON or is almost turned ON, it indicates that the low side MOSFET 222 should not be turned ON. Under this situation, the high side comparator 5121 changes the low side enable signal ENL to the disable level (high level in this embodiment) to disable the low side PWM signal SL in response to the high side driving signal UG being higher than the high side reference voltage Vref1, so as to ensure that the low side MOSFET 222 is OFF. Specifically, the high-level low side enable signal ENL is inputted to the enable logic circuit 3131. After the level shift circuit 516 shifts down the level of the output signal of the high side comparator 5121, the down-shifted output signal is inputted to the enable logic circuit 5131, such that the enable logic circuit 5131 can determine, based on the low side enable signal ENL, whether or not to enable the low side driver 513 to operate the low side MOSFET 222 according to the PWM signal P1.

The enable logic circuit 5131 is for example a NAND gate latch circuit as shown in FIG. 6. An input end of the enable logic circuit 5131, for instance the reset pin of the NAND gate latch circuit, receives the low side PWM signal SL; another end of the enable logic circuit 5131, for example the set pin of the NAND gate latch circuit, receives the down-shifted low side enable signal ENL.

When the low side PWM signal SL is at low level which represents digital zero, the enable logic circuit 5131 outputs a high-level signal which represents digital one. After this high-level signal passes through three inverters, a low side driving signal LG is generated at low level, such that the low side MOSFET 222 is OFF.

When the low side PWM signal SL is changed from low level which represents digital zero to high level which represents digital one, the logic level of the low side enable signal ENL is high level which represents digital one. The enable logic circuit 5131 outputs a high-level signal which represents digital one. The low side driving signal LG is at low level, such that the low side MOSFET 222 is correspondingly OFF. In summary, when the low side enable signal ENL is at the high level (disable), regardless what logic level the low side PWM signal SL is at, the low side driving signal LG is at low level, such that the low side MOSFET 222 is sure OFF.

On the other hand, when the high side MOSFET 221 is turned OFF and the gate-source voltage of the high side MOSFET 221 is lower than the high side reference voltage Vref1, it indicates that the low side MOSFET 222 can operate according to the low side PWM signal SL at this time. Under this situation, the high side comparator 5121 changes the low side enable signal ENL to the enable level (the low level in this embodiment) in response to the high side driving signal UG being lower than the high side reference voltage Vref1, so as to enable the low side PWM signal SL. Specifically, after the level of the output signal of the high side comparator 5121 is shifted down by the level shift circuit 516, the down-shifted output signal is inputted to the set pin of the NAND gate latch circuit of the enable logic circuit 5131. The output signal of the NAND gate latch circuit is in opposite phase with the low side PWM signal SL. After the output signal of the NAND gate latch circuit passes through three inverters, the low side driving signal LG becomes in-phase with the low side PWM signal SL. In other words, when the high side comparator 5121 changes the low side enable signal ENL to a low-level signal which represents digital zero (enable), which indicates that the high side MOSFET 221 is confirmed to be OFF, the low side driver 513 switches the low side MOSFET 222 according to the low side PWM signal SL which is in opposite phase with the PWM signal P1.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. In view of the foregoing, the spirit of the present invention should cover all such and other modifications and variations, which should be interpreted to fall within the scope of the following claims and their equivalents.

What is claimed is:

1. A switching converter circuit, which is configured to operably switch a first end of an inductor between a first voltage and a second voltage according to a pulse width modulation (PWM) signal to convert an input voltage to an output voltage, the switching converter circuit comprising:
   a high side metal oxide semiconductor field effect transistor (MOSFET) coupled between the first voltage and the first end of the inductor;
   a low side MOSFET coupled between the second voltage and the first end of the inductor; and
   a driver circuit including:
      a high side driver configured to operably generate a high side driving signal according to the PWM signal, so as to drive the high side MOSFET;
      a low side driver configured to operably generate a low side driving signal according to the PWM signal, so as to drive the low side MOSFET;
      a high side sensor circuit configured to operably sense a gate-source voltage of the high side MOSFET and generate a low side enable signal according to the gate-source voltage of the high side MOSFET, so as to indicate an OFF state of the high side MOSFET, wherein the low side enable signal enables the low side driver to switch the low side MOSFET according to the PWM signal; and
      a low side sensor circuit configured to operably sense a gate-source voltage of the low side MOSFET and generate a high side enable signal according to the gate-source voltage of the low side MOSFET, so as to indicate an OFF state of the low side MOSFET, wherein the high side enable signal enables the high side driver to switch the high side MOSFET according to the PWM signal;
   wherein the low side sensor circuit includes a low side sensor MOSFET having a conductivity type which is the same as the low side MOSFET, wherein a gate of the low side sensor MOSFET is coupled with a gate of the low side MOSFET, and a source of the low side sensor MOSFET is coupled with a source of the low side MOSFET, such that the low side sensor MOSFET generates the high side enable signal at a drain of the low side sensor MOSFET according to the gate-source voltage of the low side MOSFET.

2. The switching converter circuit of claim 1, wherein the low side sensor circuit further includes a current source coupled between the high side enable signal and a bootstrap voltage of the high side driver, such that a plurality of logic levels of the high side enable signal are level shifted to a boot voltage domain, wherein the high side driver includes an enable logic circuit configured to operably receive the high side enable signal, so as to enable the high side driver to switch the high side MOSFET according to the PWM signal.

3. The switching converter circuit of claim 1, wherein the low side sensor circuit further includes a current source coupled between the high side enable signal and a DC voltage, wherein the DC voltage is configured to operably generate a bootstrap voltage of the high side driver, wherein the high side driver includes an enable logic circuit and a level shift circuit coupled with each other to receive the high side enable signal, so as to enable the high side driver to switch the high side MOSFET according to the PWM signal.

4. The switching converter circuit of claim 1, wherein the low side sensor circuit includes a low side comparator configured to operably compare the gate-source voltage of the low side MOSFET with a low side reference voltage, so as to generate the high side enable signal, wherein the high side driver includes an enable logic circuit and a level shift circuit coupled with each other to receive the high side enable signal, so as to enable the high side driver to switch the high side MOSFET according to the PWM signal.

5. The switching converter circuit of claim 1, wherein an absolute value of a conduction threshold voltage of a high side sensor MOSFET of the high side sensor circuit is lower than or equal to an absolute value of a conduction threshold voltage of the high side MOSFET, and wherein an absolute value of a conduction threshold voltage of the low side sensor MOSFET is lower than or equal to an absolute value of a conduction threshold voltage of the low side MOSFET.

6. The switching converter circuit of claim 1, wherein the high side sensor circuit includes a high side sensor MOSFET having a conductivity type which is complementary to the high side MOSFET, wherein a gate of the high side sensor MOSFET is coupled with a source of the high side MOSFET, and a source of the high side sensor MOSFET is coupled with a gate of the high side MOSFET, such that the high side sensor MOSFET generates the low side enable signal at a drain of the high side sensor MOSFET according to the gate-source voltage of the high side MOSFET.

7. The switching converter circuit of claim 1, wherein the high side sensor circuit includes:
  a high side sensor MOSFET having a conductivity type which is the same as the high side MOSFET; and
  a high side clamper MOSFET having a conductivity type which is complementary to the high side MOSFET, wherein the high side clamper MOSFET and the high side sensor MOSFET are coupled in series to a bootstrap voltage of the high side driver;
  wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

8. The switching converter circuit of claim 1, wherein the high side sensor circuit includes:
  a high side sensor MOSFET having a conductivity type which is complementary to the high side MOSFET; and
  a high side clamper MOSFET having a conductivity type which is complementary to the high side MOSFET, wherein the high side clamper MOSFET and the high side sensor MOSFET are coupled in series to a bootstrap voltage of the high side driver;
  wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

9. The switching converter circuit of claim 1, wherein the high side sensor circuit includes:
  a high side comparator configured to operably compare the gate-source voltage of the high side MOSFET with a high side reference voltage and generate the low side enable signal according to a voltage of the first end of the inductor; and
  a level shift circuit configured to operably shift down a level of the low side enable signal;
  wherein the low side driver includes an enable logic circuit configured to operably receive the down-shifted low side enable signal, so as to enable the low side driver to switch the low side MOSFET according to the PWM signal.

10. The switching converter circuit of claim 1, wherein the high side MOSFET has a conductivity type which is the same as the low side MOSFET.

11. A driver circuit of a switching converter circuit, the driver circuit comprising:
  a high side driver configured to operably generate a high side driving signal according to a pulse width modulation (PWM) signal, so as to drive a high side metal oxide semiconductor field effect transistor (MOSFET);
  a low side driver configured to operably generate a low side driving signal according to the PWM signal, so as to drive a low side MOSFET;
  a high side sensor circuit configured to operably sense a gate-source voltage of the high side MOSFET and generate a low side enable signal according to the gate-source voltage of the high side MOSFET, so as to indicate an OFF state of the high side MOSFET, wherein the low side enable signal enables the low side driver to switch the low side MOSFET according to the PWM signal; and
  a low side sensor circuit configured to operably sense a gate-source voltage of the low side MOSFET and generate a high side enable signal according to the gate-source voltage of the low side MOSFET, so as to indicate an OFF state of the low side MOSFET, wherein the high side enable signal enables the high side driver to switch the high side MOSFET according to the PWM signal;
  wherein the low side sensor circuit includes a low side sensor MOSFET having a conductivity type which is the same as the low side MOSFET, wherein a gate of the low side sensor MOSFET is coupled with a gate of the low side MOSFET, and a source of the low side sensor MOSFET is coupled with a source of the low side MOSFET, such that the low side sensor MOSFET generates the high side enable signal at a drain of the low side sensor MOSFET according to the gate-source voltage of the low side MOSFET.

12. The driver circuit of claim 11, wherein the low side sensor circuit further includes a current source coupled between the high side enable signal and a bootstrap voltage of the high side driver, such that a plurality of logic levels of the high side enable signal are level shifted to a boot voltage domain, wherein the high side driver includes an enable logic circuit configured to operably receive the high side enable signal, so as to enable the high side driver to switch the high side MOSFET according to the PWM signal.

13. The driver circuit of claim 11, wherein the low side sensor circuit further includes a current source coupled between the high side enable signal and a DC voltage, wherein the DC voltage is configured to operably generate a bootstrap voltage of the high side driver, wherein the high side driver includes an enable logic circuit and a level shift circuit coupled with each other to receive the high side enable signal, so as to enable the high side driver to switch the high side MOSFET according to the PWM signal.

14. The driver circuit of claim 11, wherein the low side sensor circuit includes a low side comparator configured to operably compare the gate-source voltage of the low side MOSFET with a low side reference voltage, so as to generate the high side enable signal, wherein the high side driver includes an enable logic circuit and a level shift circuit coupled with each other to receive the high side enable signal, so as to enable the high side driver to switch the high side MOSFET according to the PWM signal.

15. The driver circuit of claim 12, wherein an absolute value of a conduction threshold voltage of a high side sensor MOSFET of the high side sensor circuit is lower than or equal to an absolute value of a conduction threshold voltage of the high side MOSFET, and wherein an absolute value of a conduction threshold voltage of the low side sensor MOSFET is lower than or equal to an absolute value of a conduction threshold voltage of the low side MOSFET.

16. The driver circuit of claim 11, wherein the high side sensor circuit includes a high side sensor MOSFET having a conductivity type which is complementary to the high side MOSFET, wherein a gate of the high side sensor MOSFET is coupled with a source of the high side MOSFET, and a source of the high side sensor MOSFET is coupled with a gate of the high side MOSFET, such that the high side sensor MOSFET generates the low side enable signal at a drain of the high side sensor MOSFET according to the gate-source voltage of the high side MOSFET.

17. The driver circuit of claim 11, wherein the high side sensor circuit includes:
  a high side sensor MOSFET having a conductivity type which is the same as the high side MOSFET; and a high side clamper MOSFET having a conductivity type which is complementary to the high side MOSFET, wherein the high side clamper MOSFET and the high side sensor MOSFET are coupled in series to a boot-strap voltage of the high side driver;

wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

18. The driver circuit of claim 11, wherein the high side sensor circuit includes:

a high side sensor MOSFET having a conductivity type which is complementary to the high side MOSFET; and a high side clamper MOSFET having a conductivity type which is complementary to the high side MOSFET, wherein the high side clamper MOSFET and the high side sensor MOSFET are coupled in series to a boot-strap voltage of the high side driver;

wherein a gate and a source of the high side MOSFET are correspondingly coupled to a gate of the high side sensor MOSFET and a gate of the high side clamper MOSFET respectively, such that the high side clamper MOSFET generates the low side enable signal at a drain of the high side clamper MOSFET according to the gate-source voltage of the high side MOSFET.

19. The driver circuit of claim 11, wherein the high side sensor circuit includes:

a high side comparator configured to operably compare the gate-source voltage of the high side MOSFET with a high side reference voltage and generate the low side enable signal according to a voltage of the first end of the inductor; and a level shift circuit configured to operably shift down a level of the low side enable signal;

wherein the low side driver includes an enable logic circuit configured to operably receive the down-shifted low side enable signal, so as to enable the low side driver to switch the low side MOSFET according to the PWM signal.

20. The driver circuit of claim 11, wherein the high side MOSFET has a conductivity type which is the same as the low side MOSFET.

* * * * *